US010396660B2

(12) United States Patent
Fukumoto et al.

(10) Patent No.: US 10,396,660 B2
(45) Date of Patent: Aug. 27, 2019

(54) SWITCHING REGULATOR, SEMICONDUCTOR INTEGRATED CIRCUIT, AND ELECTRONIC APPLIANCE

(71) Applicant: Rohm Co., Ltd., Kyoto (JP)

(72) Inventors: Yosuke Fukumoto, Kyoto (JP); Tadashi Akaho, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 16/301,850

(22) PCT Filed: Apr. 28, 2017

(86) PCT No.: PCT/JP2017/016903
§ 371 (c)(1),
(2) Date: Nov. 15, 2018

(87) PCT Pub. No.: WO2017/208705
PCT Pub. Date: Dec. 7, 2017

(65) Prior Publication Data
US 2019/0181750 A1    Jun. 13, 2019

(30) Foreign Application Priority Data

May 31, 2016    (JP) .................................. 2016-108913

(51) Int. Cl.
*H02M 3/156*    (2006.01)
(52) U.S. Cl.
CPC .................................. *H02M 3/156* (2013.01)
(58) Field of Classification Search
None
See application file for complete search history.

(56) References Cited

U.S. PATENT DOCUMENTS

| 5,481,178 | A | 1/1996 | Wilcox et al. |
| 5,731,694 | A | 3/1998 | Wilcox et al. |
| 5,994,885 | A | 11/1999 | Wilcox et al. |
| 6,304,066 | B1 | 10/2001 | Wilcox et al. |
| 6,700,365 | B2 * | 3/2004 | Isham ................... H02M 3/156 323/283 |

(Continued)

FOREIGN PATENT DOCUMENTS

| JP | 06-303766 | 10/1994 |
| JP | 2006-325308 | 11/2006 |
| JP | 2014-089560 | 5/2014 |

OTHER PUBLICATIONS

Japan Patent Office, International Search Report for PCT/2017016903 dated Jul. 18, 2017 (with English translation).

*Primary Examiner* — Gary L Laxton
*Assistant Examiner* — Henry E Lee, III
(74) *Attorney, Agent, or Firm* — Fish & Richardson P.C.

(57) ABSTRACT

The switching regulator has: a control unit for turning on/off an upper switch and a lower switch in a complementary manner in accordance with an output voltage; and a current extraction unit for extracting a constant current from a first end or a second end of an inductor. When under a light load, the control unit stops the switching control and fixes the upper switch and the lower switch in an off state. The constant current has positive temperature characteristics, wherein the value of the constant current is greater than or equal to a value obtained by subtracting leakage current of the lower switch from leakage current of the upper switch.

10 Claims, 9 Drawing Sheets

(56) References Cited

U.S. PATENT DOCUMENTS

| | | | | |
|---|---|---|---|---|
| 6,765,372 B2 * | 7/2004 | Isham | ............ | G01R 31/40 |
| | | | | 323/224 |
| RE40,915 E * | 9/2009 | Isham | ............ | G01R 31/40 |
| | | | | 323/224 |
| RE42,037 E * | 1/2011 | Isham | ............ | G01R 31/40 |
| | | | | 323/224 |
| 8,054,058 B2 * | 11/2011 | Liu | ............ | H02M 3/1588 |
| | | | | 323/284 |
| 8,258,763 B2 * | 9/2012 | Nakamura | ............ | H02M 3/156 |
| | | | | 323/271 |
| 8,350,551 B2 * | 1/2013 | Weng | ............ | H02M 3/1588 |
| | | | | 323/224 |
| 8,456,143 B2 * | 6/2013 | Nakashima | ............ | H02M 3/1588 |
| | | | | 323/224 |
| 8,836,302 B2 | 9/2014 | Chen | | |
| 9,024,597 B2 * | 5/2015 | Zhang | ............ | H02M 3/158 |
| | | | | 323/271 |
| 9,692,297 B2 * | 6/2017 | Archibald | ............ | H02M 3/156 |
| 9,876,426 B2 * | 1/2018 | Tateishi | ............ | H02M 3/158 |
| 9,954,442 B2 * | 4/2018 | Tsuruyama | ............ | H02M 3/1588 |
| 10,177,659 B2 * | 1/2019 | Dalena | ............ | H02M 3/158 |
| 2002/0017897 A1 | 2/2002 | Wilcox et al. | | |
| 2010/0264895 A1 * | 10/2010 | Weng | ............ | H02M 3/1588 |
| | | | | 323/285 |

* cited by examiner

SWITCHING REGULATOR, SEMICONDUCTOR INTEGRATED CIRCUIT, AND ELECTRONIC APPLIANCE

TECHNICAL FIELD

The present invention relates to a switching regulator. The present invention also relates to a semiconductor integrated circuit used in a switching regulator. The present invention further relates to an electronic appliance using a switching regulator.

BACKGROUND ART

One example of switching regulators with high efficiency under a light load is a switching regulator proposed in Patent Document 1.

The switching regulator proposed in Patent Document 1 stops switching control under a light load and holds an upper switching element and a lower switching element in an off state. Stopping switching control eliminates switching loss, and thus the switching regulator proposed in Patent Document 1 offers high efficiency under a light load.

When the switching regulator proposed in Patent Document 1 finds an output voltage to have lowered while not performing switching control, it restarts switching control. After switching control is restarted, the switching regulator proposed in Patent Document 1 stops switching control again if the load is light, and continues switching control if the load is heavy.

LIST OF CITATIONS

Patent Literature

Patent Document 1: JP-A-H06-303766

SUMMARY OF THE INVENTION

Problem to be Solved by the Invention

However, in the switching regulator proposed in Patent Document 1, under a light load, if the charge current of an output capacitor that is generated by the leakage current of the upper switching element is larger than the discharge current of the output capacitor that is generated by the leakage current of the lower switching element and a consumption current of the load, the output voltage increases. In that case, switching control is not restarted, and the output voltage eventually becomes an overvoltage.

Against the background discussed above, it is an object of the present invention to provide a switching regulator that can prevent the output voltage from increasing while suppressing lowering of efficiency at low temperature during a period in which switching control is not performed, as well as to provide a semiconductor integrated circuit used in the switching regulator and an electronic appliance using the switching regulator.

Means for Solving the Problem

A switching regulator disclosed herein is a switching regulator configured to generate an output voltage from an input voltage, and comprises an upper switch of which a first terminal is connected to a first application terminal to which the input voltage is applied, a lower switch of which a first terminal is connected to a second terminal of the upper switch and of which a second terminal is connected to a second application terminal to which a predetermined voltage lower than the input voltage is applied, an inductor of which a first terminal is connected to a connection node between the upper switch and the lower switch, an output capacitor connected to a second terminal of the inductor, a controller configured to generate a control signal for complementarily turning on and off the upper switch and the lower switch according to the output voltage, and a current extractor configured to extract a constant current from the first terminal or the second terminal of the inductor. In the switching regulator disclosed herein, the controller is configured, under a light load, to stop switching control and hold the upper switch and the lower switch in an off state, and the constant current may have a positive temperature characteristic and the value of the constant current may be larger than the value obtained by subtracting the leakage current of the lower switch from the leakage current of the upper switch (a first configuration).

In the switching regulator of the first configuration described above, the upper switch may be a MOSFET (a second configuration).

In the switching regulator of the first or second configuration described above, the current extractor may be configured, during a period in which the controller is performing switching control, not to extract the constant current from the first terminal or the second terminal of the inductor (a third configuration).

In the switching regulator of any one of the first to the third configurations described above, the current extractor may include a transistor which is always in an off state and a constant current generator configured to generate the constant current which is substantially proportional to the leakage current of the transistor, and the leakage current of the transistor may be substantially proportional to the leakage current of the upper switch (a fourth configuration).

In the switching regulator of the fourth configuration described above, the leakage current of the transistor may be smaller than the leakage current of the upper switch. (a fifth configuration).

In the switching regulator of the fourth or fifth configuration described above, the constant current generator may be configured, during a period in which the controller is performing switching control, not to generate the constant current (a sixth configuration).

In the switching regulator of the sixth configuration described above, it may be configured that no leakage current of the transistor is supplied to the constant current generator during a period in which the controller is performing switching control (a seventh configuration).

A semiconductor integrated circuit disclosed herein forms at least a part of the switching regulator of any one of the first to the seventh configurations described above and has the upper switch and the current extractor (an eighth configuration).

The semiconductor integrated circuit of the eights configuration described above may further comprise a voltage divider circuit configured to divide the output voltage. In the semiconductor integrated circuit of the eights configuration described above, the current extractor may extract the constant current from the second terminal of the inductor externally fitted to the semiconductor integrated circuit (a ninth configuration).

An electronic appliance disclosed herein comprises the switching regulator according to any one of the first to the seventh configuration described above (a tenth configuration).

Advantageous Effects of the Invention

With a switching regulator, a semiconductor integrated circuit, and an electronic appliance which are disclosed herein, it is possible to prevent the output voltage from increasing while suppressing lowering of efficiency at low temperature during a period in which the switching regulator is not performing switching control.

DESCRIPTION OF EMBODIMENTS

A First Configuration Example

Figure 1:
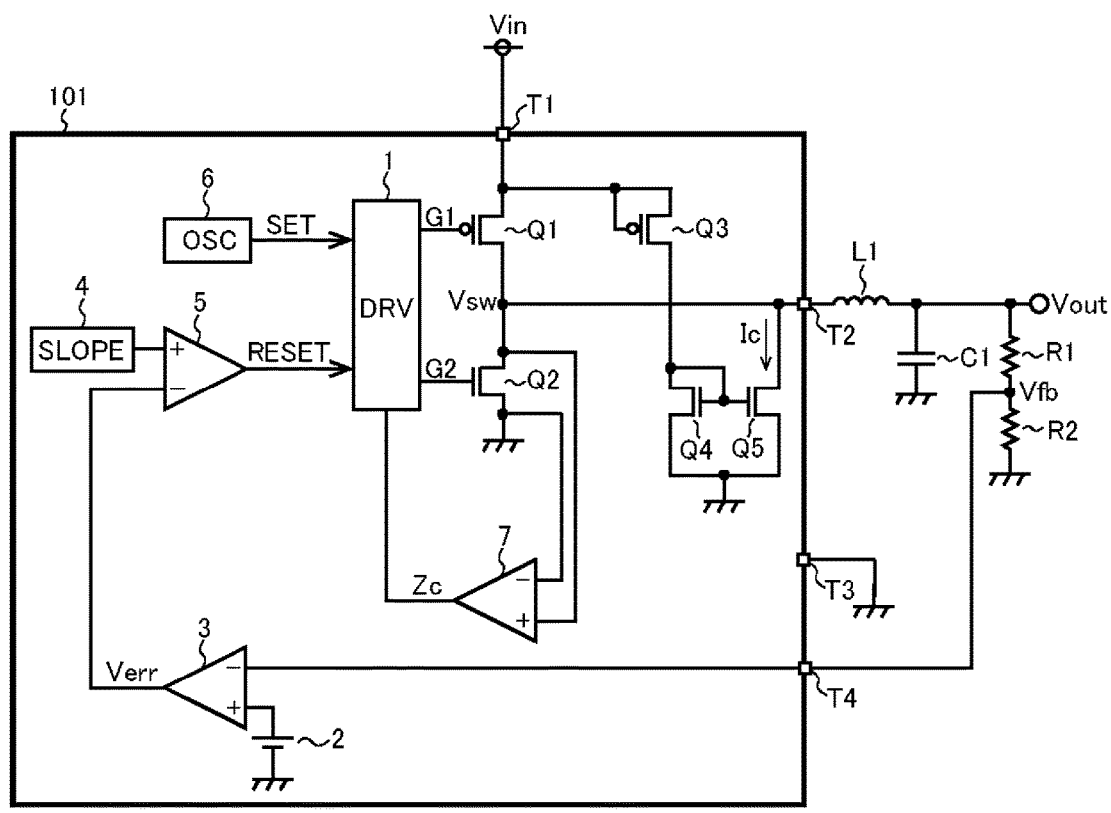
FIG. 1 A diagram showing a first configuration example of a switching regulator.

FIG. 1 is a diagram showing a first configuration example of a switching regulator. The switching regulator of this configuration example includes a semiconductor integrated circuit 101, an inductor L1, an output capacitor C1, and voltage division resistors R1 and R2.

The semiconductor integrated circuit 101 includes a driver 1, a reference voltage source 2, an error amplifier 3, a slope circuit 4, comparators 5 and 7, an oscillator 6, an upper transistor Q1, a lower transistor Q2, transistors Q3 to Q5, and terminals T1 to T4. The upper transistor Q1 and the transistor Q3 are P channel MOSFETs (metal oxide semiconductor field-effect transistors). The lower transistor Q2, the transistor Q4, and the transistor Q5 are N channel MOSFETs.

In accordance with a set signal SET, a reset signal RESET, and a reverse current sense signal Zc, the driver 1 generates a gate signal G1 for the upper MOS transistor Q1 and a gate signal G2 for the lower MOS transistor Q2.

The upper transistor Q1 is one example of an upper switch that switches, between conducting and cut-off states, a current path from the terminal T1, to which an input voltage Vin is applied, to the terminal T2. To the gate of the upper transistor Q1, the gate signal G1 is fed from the driver 1. The upper transistor Q1 turns on when the gate signal G1 is at low level, and turns off when the gate signal G1 is at high level.

The lower transistor Q2 is one example of a lower switch that switches, between conducting and cut-off states, the current path from the terminal T3, which is grounded, to the terminal T2. To the gate of the lower transistor Q2, the gate signal G2 is fed from the driver 1. The lower transistor Q2 turns on when the gate signal G2 is at high level, and turns off when the gate signal G2 is at low level. Instead of the lower transistor Q2, a diode can be used as a lower switch.

The upper transistor Q1 and the lower transistor Q2 turn on and off in a complementary manner through switching control by the driver 1. Thus, while the driver 1 performs switching control, the switch voltage Vsw that appears at the connection node between the upper transistor Q1 and the lower transistor Q2 is a pulsating voltage. When the upper transistor Q1 and the lower transistor Q2 switch between ON and OFF, it is preferable to provide a dead time during which both the upper transistor Q1 and the lower transistor Q2 are off.

The inductor L1 and the output capacitor C1 smooth the switch voltage Vsw to generate an output voltage Vout.

The voltage division resistors R1 and R2 divide the output voltage Vout to generate a feedback voltage Vfb.

The error amplifier 3 generates an error signal Verr commensurate with the difference between the feedback voltage Vfb and a reference voltage output from the reference voltage source 2.

The slope circuit 4, in synchronism with a clock signal of a predetermined frequency generated by the oscillator 6, charges and discharges an unillustrated capacitor with an unillustrated constant current circuit, a resistor, and the like, and thereby generates and outputs a triangular or sawtooth slope voltage. It is also possible to configure the switching regulator as a current mode control type by reflecting information on the current passing the inductor L1 on the slope voltage.

The comparator 5 compares the output voltage of the slope circuit 4 and the error signal Verr to generate a reset signal RESET as a comparison signal. The slope voltage generated by the slope circuit 4 has a fixed period, and thus the reset signal RESET is a PWM (pulse width modulation) signal.

The oscillator 6 generates a set signal SET as a clock signal of a predetermined frequency.

The comparator 7 compares the drain voltage and the source voltage of the lower transistor Q2 to generate and output the reverse current sense signal Zc. If a forward current (normal current), that is, a current from the terminal T3 to the terminal T2, passes through the lower transistor Q2, the reverse current sense signal Zc turns to low level. On the other hand, if a reverse current, that is, a current from the terminal T2 to the terminal T3, passes through the lower transistor Q2, the reverse current sense signal Zc turns to high level. It is also possible to modify the interconnection between the comparator 7 and the lower transistor Q2 such that the reverse current sense signal Zc has the opposite polarity to that in this configuration example.

The driver 1, under a heavy load, performs switching control. Specifically, under a heavy load, when the set signal SET switches from low level to high level, the driver 1 switches the gate signal G1 from high level to low level, and when the reset signal RESET switches from low level to high level, the driver 1 switches the gate signal G1 from low level to high level.

On the other hand, the driver 1, under a light load (except immediately after the output voltage Vout has become lower than a predetermined value), stops switching control. Specifically, the driver 1, under a light load (except immediately after the output voltage Vout has become lower than the predetermined value), fixes the gate signal G1 at high level and the gate signal G2 at low level. With this, under a light load (except immediately after the output voltage Vout has become lower than the predetermined value), the upper transistor Q1 and the lower transistor Q2 are held in an off state. When the reverse current sense signal Zc switches from low level to high level, the driver 1 judges that the load has switched from a heavy load to a light load.

If the driver 1, while not performing switching control, judges that the output voltage Vout has become smaller than the predetermined value, it restarts switching control. Specifically, the driver 1, while not performing switching control, monitors whether the period from the time point when the set signal SET switches from low level to high level to the time point when the reset signal RESET switches from low level to high level is longer than or equal to a threshold value. If the period is longer than or equal to the threshold value, the driver 1 judges that the output voltage Vout has become smaller than the predetermined value. After switching control is restarted, if the load is light, the driver 1 stops switching control again, and if the load is heavy, the driver 1 continues switching control.

Stopping switching control eliminates switching loss, and thus the switching regulator of this configuration example which operates as described above offers high efficiency under a light load.

A current extractor formed by the transistors Q3 to Q5 is a circuit provided to prevent the output voltage from increasing while suppressing lowering of efficiency at low temperature during a period in which the driver 1 is not performing switching control.

The transistor Q3 is a P channel MOSFET. The gate and the source of the transistor Q3 are connected to the terminal T1. Thus the transistor Q3 is always in an off state and lets only a leakage current pass.

In this configuration example, the gate length of the transistor Q3 and the gate length of upper transistor Q1 are made equal so that the leakage current (subthreshold leakage current) of the transistor Q3 is substantially proportional to the leakage current (subthreshold leakage current) of the upper transistor Q1. Also, in this configuration example, the gate width of the transistor Q3 is made smaller than the gate width of the upper transistor Q1 so that the leakage current of the transistor Q3 is smaller than the leakage current of the upper transistor Q1. In order to match the temperatures of the upper transistor Q1 and the transistor Q3 as well as possible, it is preferable to arrange the upper transistor Q1 and the transistor Q3 close to each other.

Figure 2:
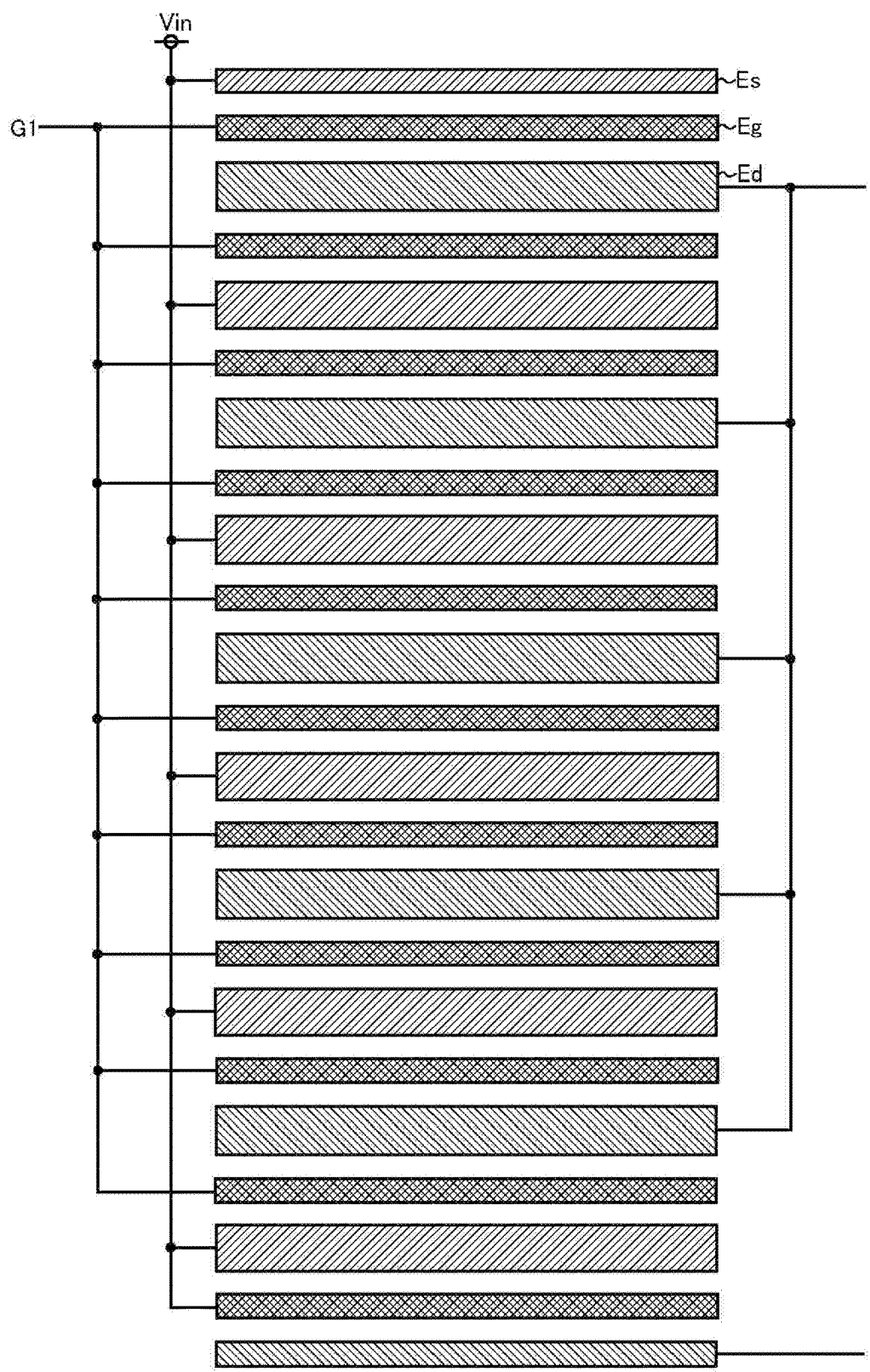
FIG. 2 A top view of an example of arrangement of electrodes in an upper transistor and a transistor that is always in an off state.

Thus, for example, gate electrodes Eg, drain electrodes Ed, and source electrodes Es of the upper transistor Q1 and the transistor Q3 can be arranged as shown in FIG. 2. In the arrangement shown in FIG. 2, the gate length of the transistor Q3 is equal to the gate length of the upper transistor Q1, and the gate width of the transistor Q3 is 1/10 of the gate width of the upper transistor Q1; thus the leakage current of the transistor Q3 is 1/10 of the leakage current of the upper transistor Q1.

The transistors Q4 and Q5, which are N channel MOSFETs, constitute a current mirror circuit. The current mirror circuit formed by the transistors Q4 and Q5 extracts from the terminal T2 a constant current Ic that is substantially proportional to the leakage current of the transistor Q3. The mirror ratio of the current mirror circuit is set such that the value of the constant current Ic is larger than or equal to the value obtained by subtracting the leakage current of the lower transistor Q2 from the leakage current of the upper transistor Q1. For example, when the leakage current of the transistor Q3 is 1/10 of the leakage current of the upper transistor Q1, if the mirror ratio of the current mirror circuit is made 10 times as large, the value of the constant current Ic equals the leakage current of the upper transistor Q1, and if the mirror ratio of the current mirror circuit is made 20 times as large, the value of the constant current Ic is twice as large as the leakage current of the upper transistor Q1. The leakage current of the transistor Q3 has a positive temperature characteristic, and thus the constant current Ic also has a positive temperature characteristic.

Figure 3:
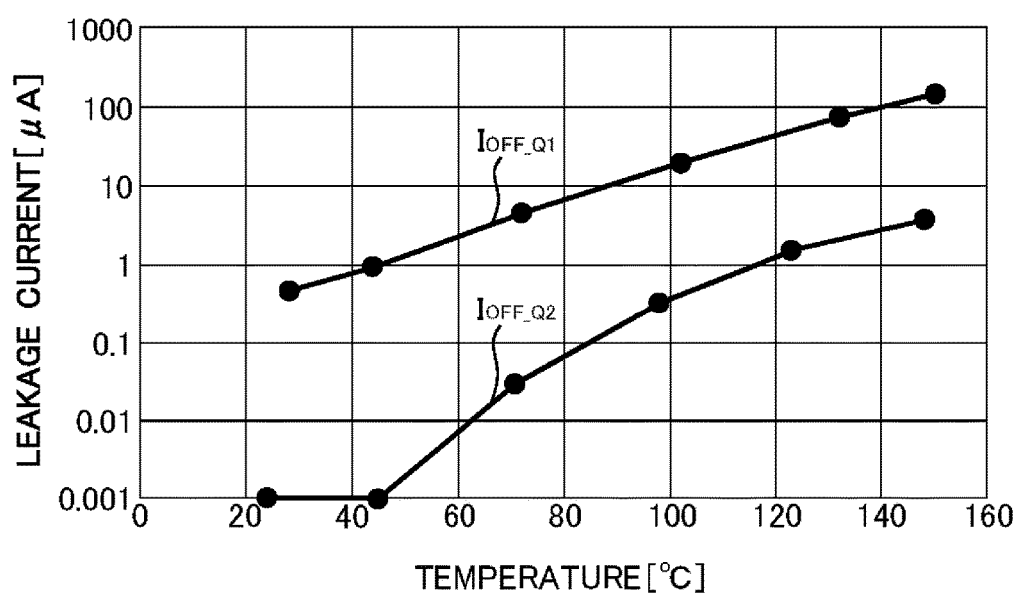
FIG. 3 A diagram showing the leakage current of an upper transistor and a lower transistor.

Here, miniaturizing the upper transistor Q1 that has the larger area makes the gate length of the upper transistor Q1 smaller, and thus, for example as shown in FIG. 3, the leakage current $I_{OFF\_Q1}$ of the upper transistor Q1 becomes much larger than the leakage current $I_{OFF\_Q2}$ of the lower transistor Q2. Thus, miniaturization of the upper transistor Q1 is more likely to cause a situation where, under a light load, the charge current of the output capacitor C1 that is generated by the leakage current of the upper transistor Q1 becomes larger than the discharge current of the output capacitor C1 that is generated by the leakage current of the lower transistor Q2 and a consumption current of the load. As will be clear from FIG. 3, the above situation is more likely to occur when the temperature is high than when the temperature is low.

Figure 4:
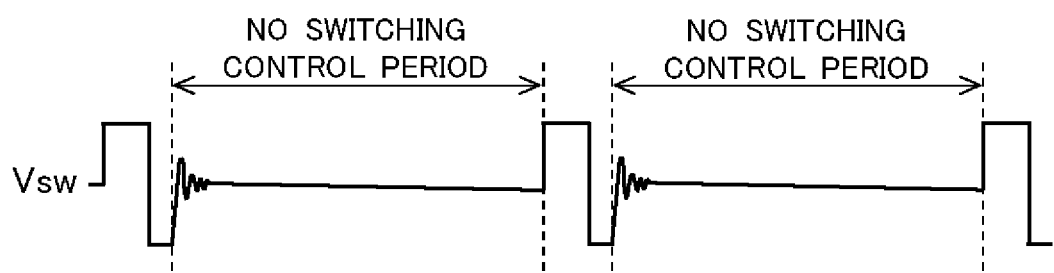
FIG. 4 A time chart of a switch voltage in the first configuration example.

However, in the switching regulator of this configuration example, there is also the discharge current of the output capacitor C1 generated by the constant current Ic, and the value of the constant current Ic is larger than the value obtained by subtracting the leakage current of the lower transistor Q2 from the leakage current of the upper transistor Q1. Thus, under a light load, the charge current of the output capacitor C1 never becomes larger than the total discharge current of the capacitor C1. Thus, as shown in FIG. 4, while the driver 1 is not performing switching control, the switch voltage Vsw does not increase. Thus, the switching regulator of this configuration example can prevent the output voltage Vout from increasing while the driver 1 is not performing switching control. Furthermore, the constant current Ic has a positive temperature characteristic and thus the constant current Ic extracted from the terminal T2 by the current extractor at low temperature does not become excessive. Thus, the switching regulator of this configuration example can suppress lowering of efficiency at low temperature.

Figure 5:
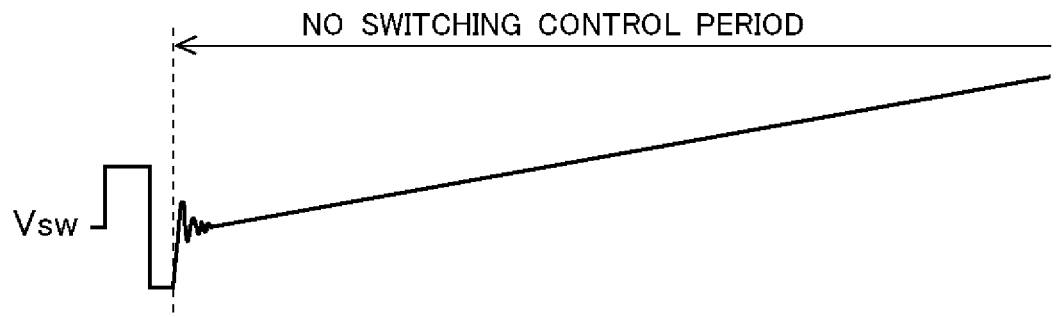
FIG. 5 A time chart of a switch voltage in a comparison example.

On the other hand, if a current extractor is not provided unlike in this configuration example, when the above situation occurs, as shown in FIG. 5, the switch voltage Vsw increases while the driver 1 is not performing switching control. As the switch voltage Vsw increases, the output voltage Vout increases. Thus the switching control is not restarted, and, inconveniently, the output voltage Vout eventually becomes an overvoltage.

A Second Configuration Example

Figure 6:
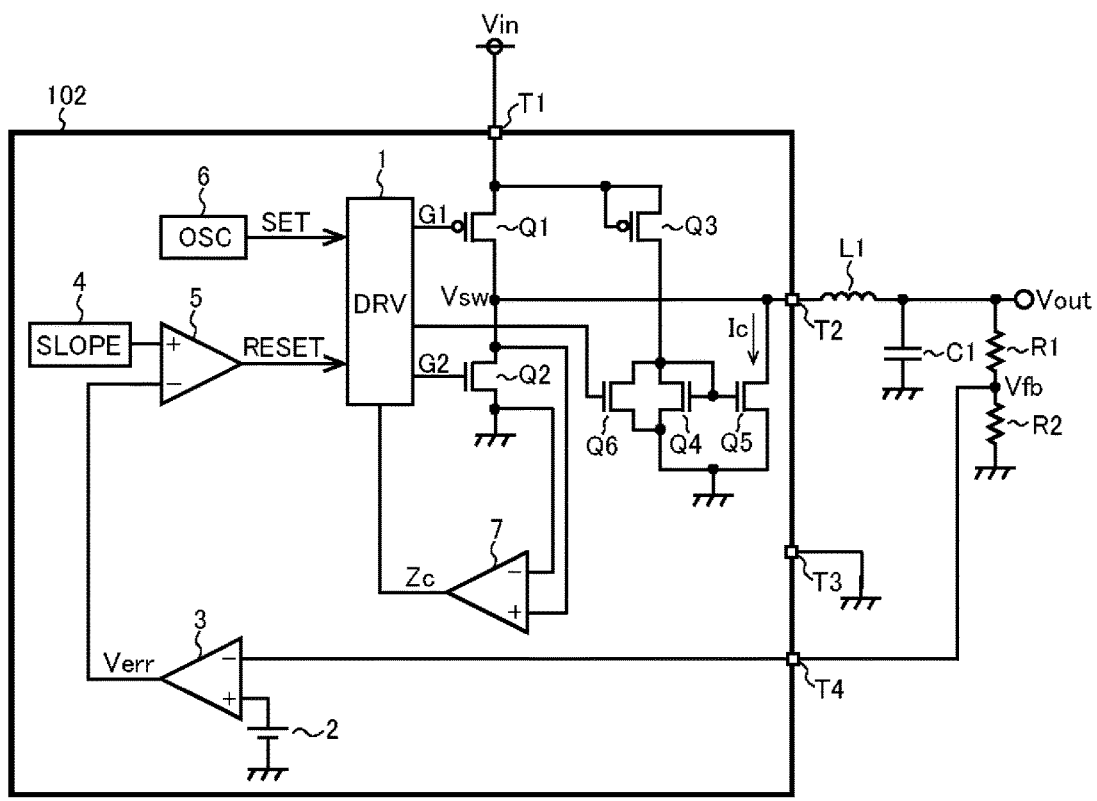
FIG. 6 A diagram showing a second configuration example of the switching regulator.

FIG. 6 is a diagram showing a second configuration example of a switching regulator. The switching regulator of this configuration example has a configuration where the semiconductor integrated circuit 101 in the switching regulator of the first configuration example is replaced with a semiconductor integrated circuit 102. The semiconductor integrated circuit 102 has a configuration where a transistor Q6 is added to the semiconductor integrated circuit 101. For features of this configuration example similar to those of the first configuration example, no overlapping description will be repeated.

The transistor Q6 is an N channel MOSFET. The transistor Q6 is connected in parallel with the transistor Q4. The driver 1 controls the ON/OFF state of the transistor Q6.

Specifically, the driver 1 keeps on the transistor Q6 in a period in which switching control is performed, and keeps off the transistor Q6 in a period in which switching control is not performed. With this, in the period in which switching control is performed, the leakage current of the transistor Q3 is not supplied to the current mirror circuit formed by the resistors Q4 and Q5, and the constant current Ic is not extracted from the terminal T2. This results in improved efficiency in the period in which switching control is performed compared to in the first configuration example.

A Third Configuration Example

Figure 7:
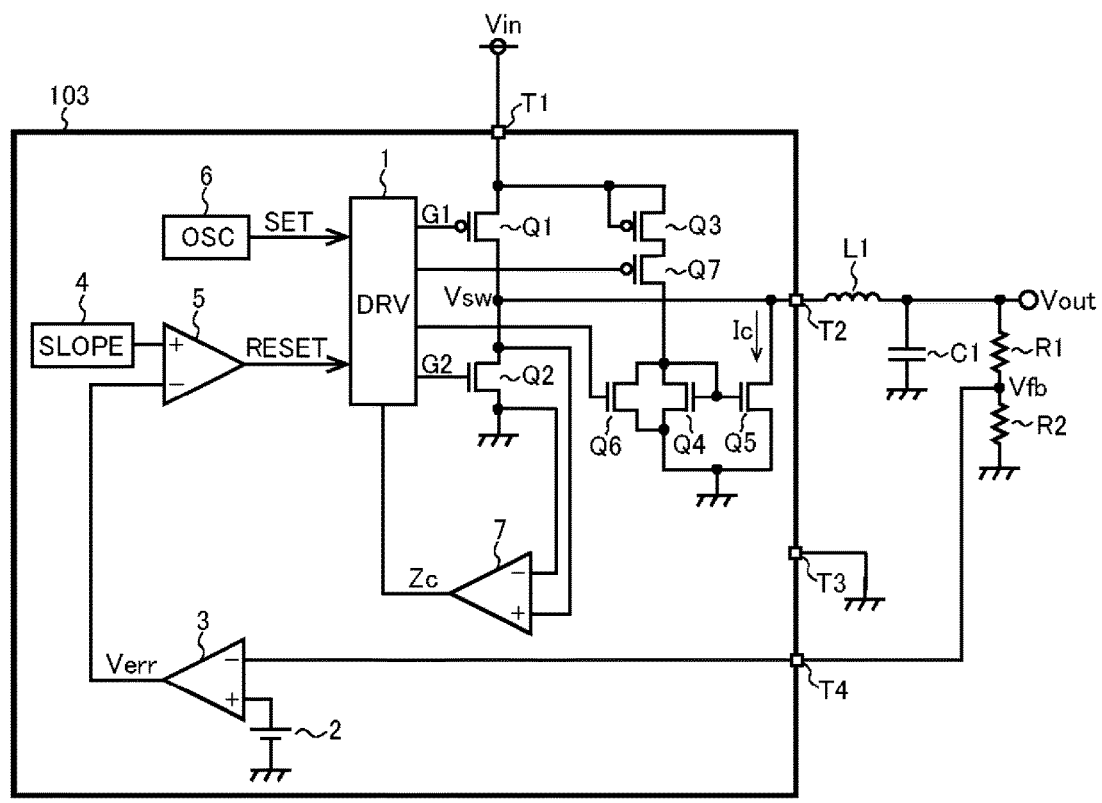
FIG. 7 A diagram showing a third configuration example of the switching regulator.

FIG. 7 is a diagram showing a third configuration example of a switching regulator. The switching regulator of this configuration example has a configuration where the semiconductor integrated circuit 102 in the switching regulator of the second configuration example is replaced with a semiconductor integrated circuit 103. The semiconductor integrated circuit 103 has a configuration where a transistor Q7 is added to the semiconductor integrated circuit 102. For features of this configuration example similar to those of the second configuration example, no overlapping description will be repeated.

The transistor Q7 is a P channel MOSFET. The transistor Q7 is provided between the transistor Q3 and the transistors Q4 and Q6. The transistor Q7 is given such a structure that its leakage current is smaller than that of the transistor Q3.

The driver 1 controls ON and OFF of the transistor Q7. Specifically, the driver 1 keeps off the transistor Q7 in a period in which switching control is performed, and keeps on the transistor Q7 in a period in which switching control is not performed. With this, the current that passes through the transistor Q6 in the period in which switching control is performed can be made smaller than that in the first configuration example. This results in improved efficiency in the period in which switching control is performed compared to in the second configuration example.

A Fourth Configuration Example

Figure 8:
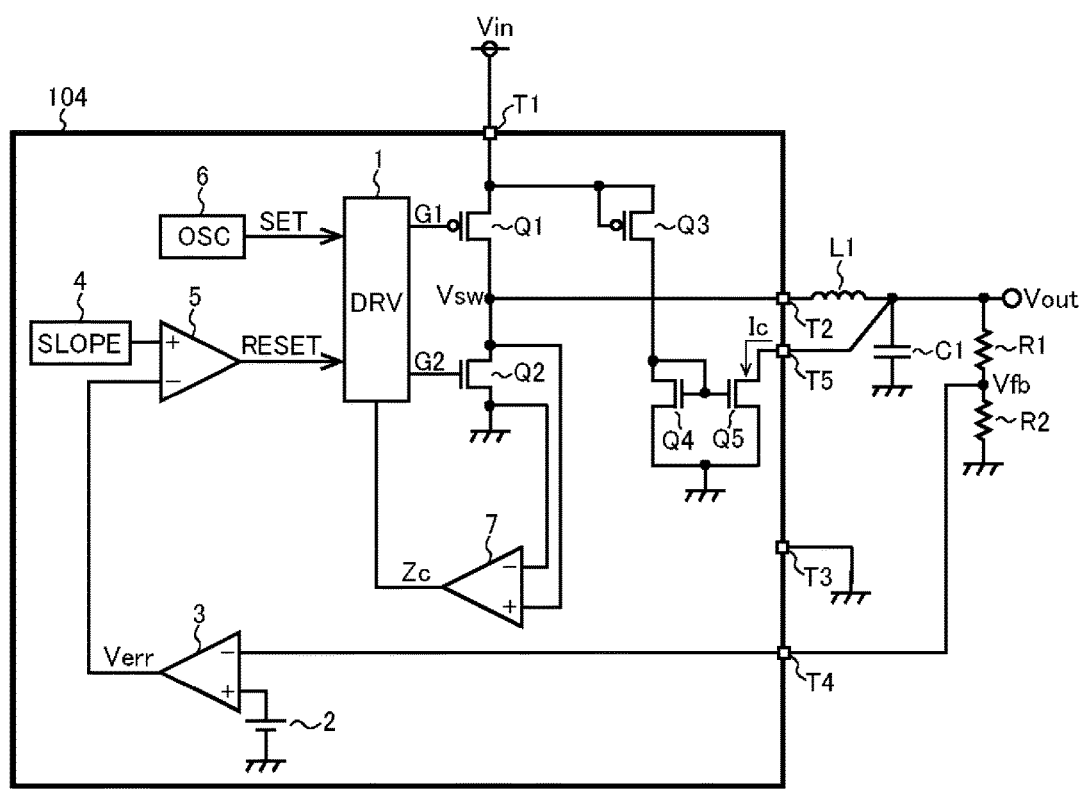
FIG. 8 A diagram showing a fourth configuration example of the switching regulator.

FIG. 8 is a diagram showing a fourth configuration example of a switching regulator. The switching regulator of this configuration example has a configuration where the semiconductor integrated circuit 101 in the switching regulator of the first configuration example is replaced with a semiconductor integrated circuit 104 and an output voltage Vout is applied to a terminal T5, which will be described later, of the semiconductor integrated circuit 104. The semiconductor integrated circuit 104 has a configuration where the terminal T5 is added to the semiconductor integrated circuit 101 and the connection destination of the drain of the transistor Q5 is changed from the terminal T2 to the terminal T5. For features of this configuration example similar to those of the first configuration example, no overlapping description will be repeated.

In the switching regulator of this configuration example, unlike in the switching regulator of the first configuration example, the current mirror circuit constituted by the transistors Q4 and Q5 extracts the constant current Ic from the terminal T5 instead of from the terminal T2. The switching regulator of this configuration example provides a similar effect to the switching regulator of the first configuration example. The switching regulator of this configuration example has a larger number of terminals in the semiconductor integrated circuit than the switching regulator of the first configuration example.

A Fifth Configuration Example

Figure 9:
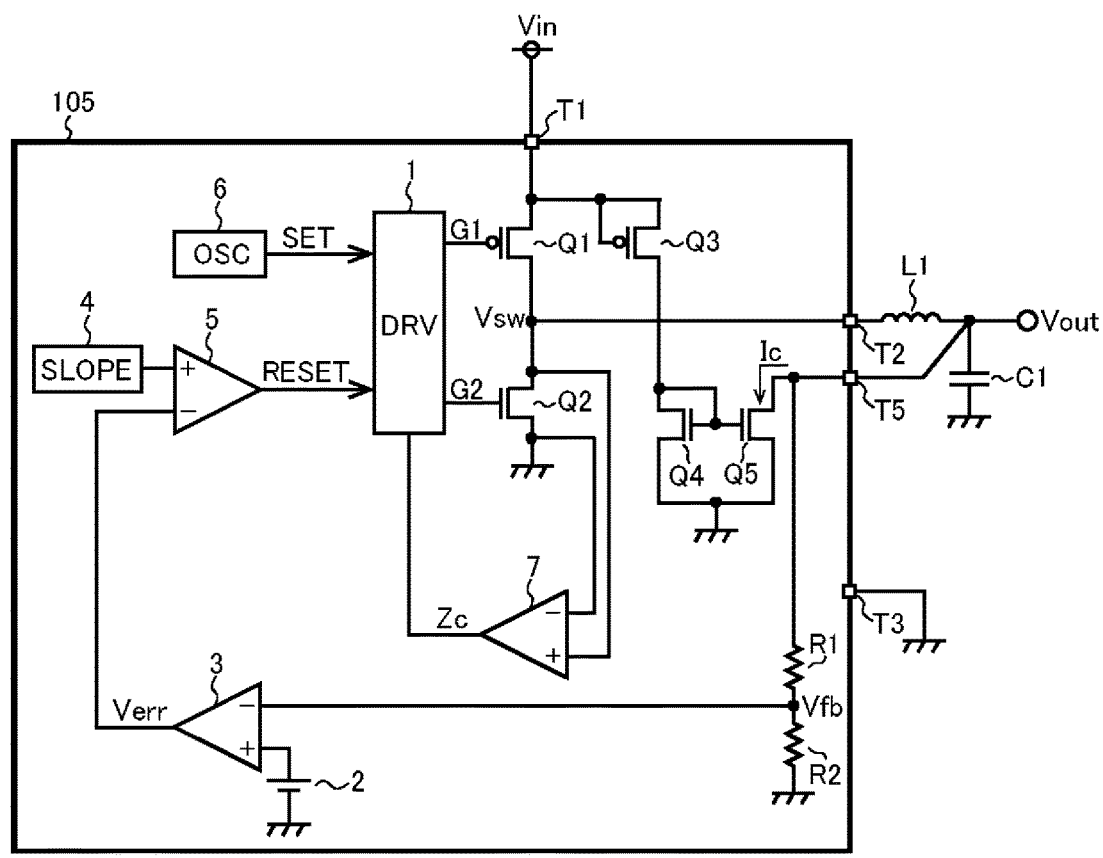
FIG. 9 A diagram showing a fifth configuration example of the switching regulator.

FIG. 9 is a diagram showing a fifth configuration example of a switching regulator. The switching regulator of this configuration example has a configuration where the semiconductor integrated circuit 104 in the switching regulator of the fourth configuration example is replaced with a semiconductor integrated circuit 105 and the voltage division resistors R1 and R2 are incorporated in the semiconductor integrated circuit 105. The semiconductor integrated circuit 105 has a configuration where the voltage division resistors R1 and R2 are added to and the terminal T4 is removed from the semiconductor integrated circuit 104. For features of this configuration example similar to those of the fourth configuration example, no overlapping description will be repeated.

In this configuration example, the voltage division resistors R1 and R2 are incorporated in the semiconductor integrated circuit 105, and thus the voltage dividing ratio of the voltage divider circuit formed by the voltage division resistors R1 and R2 is specific to the semiconductor integrated circuit 105. The switching regulator of this configuration example provides a similar effect to the switching regulator of the fourth configuration example. In the switching regulator of this configuration example, unlike in the switching regulator of the fourth configuration example, the number of the terminals in the semiconductor integrated circuit can be made equal to that in the switching regulator of the first configuration example.

Examples of Application of the Switching Regulator

Figure 10:
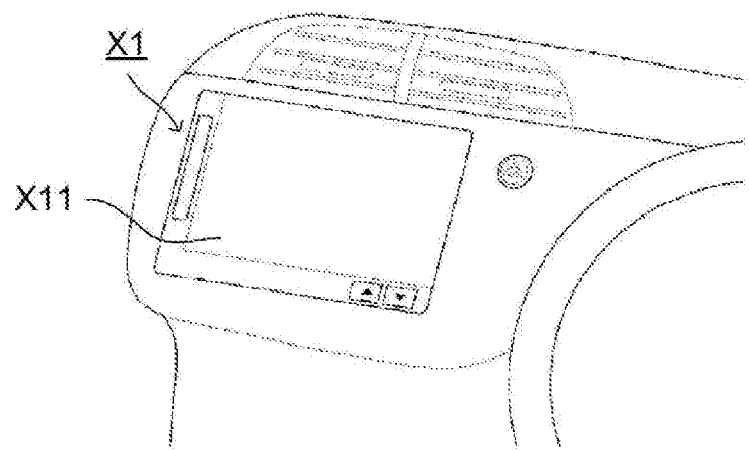
FIG. 10 An exterior view of a display device provided in a vehicle-mounted navigation device.

The switching regulator described above can be used, for example, as a power supply device for supplying a supply voltage to a CPU (unillustrated) in a vehicle-mounted navigation device X1. The vehicle-mounted navigation device X1 includes a display device that displays navigation information. A display panel X11 of the display device is provided in a front part of the cabin in a vehicle (see FIG. 10).

Figure 11:
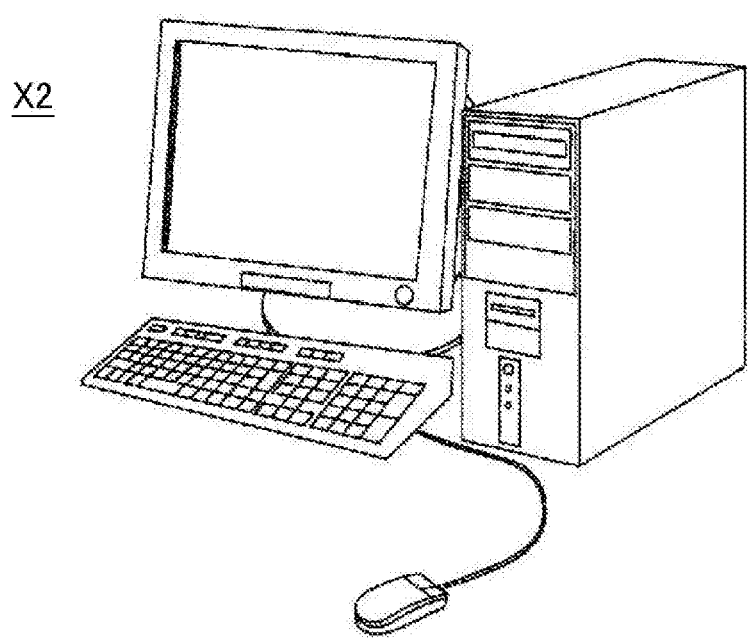
FIG. 11 An exterior view of a personal computer.

The switching regulator described above can also be used, for example, as a power supply device for supplying a supply voltage to a CPU (unillustrated) in a personal computer X2 as shown in FIG. 11.

<Points to Note>

The various technical features disclosed herein can be implemented in any other manner than in the embodiments described above and allow for many modifications and variations within the spirit of their technical ingenuity.

For example, in the above embodiments, a P channel MOSFET is used as an upper switch. Instead, any other switch that has a leakage current with a positive temperature characteristic may be used as an upper switch.

For another example, unlike in the above embodiments, it is also possible to use, instead of the transistor Q3, a constant voltage source that generates a constant voltage with a substantially zero temperature characteristic and a resistor that is connected to the constant current source and that has a negative temperature characteristic.

In the above embodiments, based on the reverse current sense signal Zc, it is judged that the load has switched from a heavy load to a light load. Instead, any other judging method may be used. For example, the current passing through the inductor L1 may be monitored so that, when the average value of the current passing through the inductor L1 has become lower than a predetermined value, it can be judged that the load has switched from a heavy load to a light load.

In the above embodiments, based on the set signal SET and the reset signal RESET, it is judged that the output voltage Vout has become smaller than a predetermined value. Instead, any other judging method may be used. For example, a comparator that compares the feedback voltage Vfb with the constant voltage may be provided so that it is possible to judge from the output of the comparator that the output voltage Vout has become smaller than a predetermined value.

It is possible to apply to the fourth configuration example modifications similar to those from the first configuration example to the second configuration example, and it is also possible to apply to the fifth configuration example modifications similar to those from the first configuration example to the second configuration example.

The above embodiments should be understood to be in every aspect illustrative and not restrictive. The scope of the present invention is defined not by the description of the embodiments given above but by the appended claims, and should be understood to encompass any modifications made in the sense and scope equivalent to those of the claims.

INDUSTRIAL APPLICABILITY

This invention finds application in switching regulators used in any fields (in the fields of electrical appliances, automobiles, industrial machinery, and so on).

LIST OF REFERENCE SIGNS 1 driver
2 reference voltage source
3 error amplifier
4 slope circuit
5, 7 comparator
6 oscillator
101-105 semiconductor integrated circuit
C1 output capacitor
Eg gate electrode
Ed drain electrode
Es source electrode
L1 inductor
R1, R2 voltage division resistor
Q1 upper transistor
Q2 lower transistor
Q3-Q7 transistor
T1-T5 terminal
X1 vehicle-mounted navigation device
X11 display panel
X2 personal computer

The invention claimed is:

1. A switching regulator configured to generate an output voltage from an input voltage, the switching regulator comprising:
    an upper switch of which a first terminal is connected to a first application terminal to which the input voltage is applied;
    a lower switch of which a first terminal is connected to a second terminal of the upper switch and of which a second terminal is connected to a second application terminal to which a predetermined voltage lower than the input voltage is applied;
    an inductor of which a first terminal is connected to a connection node between the upper switch and the lower switch;
    an output capacitor connected to a second terminal of the inductor;
    a controller configured to generate a control signal for complementarily turning on and off the upper switch and the lower switch according to the output voltage; and
    a current extractor configured to extract a constant current from the first terminal or the second terminal of the inductor, wherein
    the controller is configured, under a light load, to stop switching control and hold the upper switch and the lower switch in an off state, and
    the constant current has a positive temperature characteristic and a value of the constant current is larger than a value obtained by subtracting a leakage current of the lower switch from a leakage current of the upper switch.

2. The switching regulator according to claim 1, wherein the upper switch is a MOSFET.

3. The switching regulator according to claim 1, wherein the current extractor is configured, during a period in which the controller is performing switching control, not to extract the constant current from the first terminal or the second terminal of the inductor.

4. The switching regulator according claim 1, wherein the current extractor includes
    a transistor which is always in an off state, and
    a constant current generator configured to generate the constant current which is substantially proportional to a leakage current of the transistor, and
    the leakage current of the transistor is substantially proportional to the leakage current of the upper switch.

5. The switching regulator according to claim 4, wherein the leakage current of the transistor is smaller than the leakage current of the upper switch.

6. The switching regulator according to claim 4, wherein the constant current generator is configured, during a period in which the controller is performing switching control, not to generate the constant current.

7. The switching regulator according to claim 6, wherein no leakage current of the transistor is supplied to the constant current generator during a period in which the controller is performing switching control.

8. A semiconductor integrated circuit which forms at least a part of the switching regulator according to claim 1, wherein the semiconductor integrated circuit has the upper switch and the current extractor.

9. The semiconductor integrated circuit according to claim 8, further comprising a voltage divider circuit configured to divide the output voltage, wherein the current extractor extracts the constant current from the second terminal of the inductor externally fitted to the semiconductor integrated circuit.

10. An electronic appliance comprising the switching regulator according to claim 1.

* * * * *